United States Patent
Kim

(10) Patent No.: US 10,256,281 B2
(45) Date of Patent: *Apr. 9, 2019

(54) ORGANIC LIGHT EMITTING DISPLAY DEVICE WITH FIRST AND SECOND PIXEL DEFINING LAYERS

(71) Applicant: SAMSUNG DISPLAY CO., LTD., Yongin-si, Gyeonggi-Do (KR)

(72) Inventor: Jae-Hoon Kim, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/380,759

(22) Filed: Dec. 15, 2016

(65) Prior Publication Data
US 2017/0179209 A1 Jun. 22, 2017

(30) Foreign Application Priority Data
Dec. 22, 2015 (KR) ........................ 10-2015-0183551

(51) Int. Cl.
*H01L 27/32* (2006.01)

(52) U.S. Cl.
CPC ...... *H01L 27/3246* (2013.01); *H01L 27/3258* (2013.01); *H01L 27/3276* (2013.01)

(58) Field of Classification Search
CPC ............. H01L 27/3246; H01L 27/3258; H01L 27/3276
USPC ..................... 257/40, 88, E27.119
See application file for complete search history.

(56) References Cited

U.S. PATENT DOCUMENTS

| 9,391,304 | B2* | 7/2016 | Lee | ......................... H01L 51/56 |
| 2013/0240914 | A1* | 9/2013 | Jin | ...................... H01L 27/3246 257/88 |
| 2014/0070175 | A1* | 3/2014 | Kang | ...................... H01L 51/52 257/40 |

FOREIGN PATENT DOCUMENTS

KR 10-2014-0045157 4/2014

* cited by examiner

*Primary Examiner* — Robert T Huber
(74) *Attorney, Agent, or Firm* — F. Chau & Associates, LLC

(57) ABSTRACT

An organic light emitting display device includes, a light emitting structure, a pixel defining structure that includes first and second pixel defining layers, and a first wiring. The light emitting structure is disposed on a substrate and includes a pixel electrode, an organic light emitting layer and an opposite electrode. The first pixel defining layer is disposed on the substrate and partially covers the pixel electrode. The second pixel defining layer is disposed on the first pixel defining layer. The first wiring is disposed between the substrate and the first pixel defining layer and between the substrate and the second pixel defining layer, and is in contact with the first pixel defining layer and the second pixel defining layer. An adhesive strength between the second pixel defining layer and the first wiring is greater than an adhesive strength between the second pixel defining layer and the first pixel defining layer.

17 Claims, 7 Drawing Sheets

ORGANIC LIGHT EMITTING DISPLAY DEVICE WITH FIRST AND SECOND PIXEL DEFINING LAYERS

CROSS-REFERENCE TO RELATED APPLICATIONS

This application claims priority under 35 USC § 119 from, and the benefit of, Korean Patent Application No. 10-2015-0183551, filed on Dec. 22, 2015 in the Korean Intellectual Property Office (KIPO), the contents of which are herein incorporated by reference in their entirety.

BACKGROUND

1. Technical Field

Exemplary embodiments are directed to display devices. More particularly, exemplary embodiments are directed to organic light emitting display devices that include pixel defining structures.

2. Discussion of the Related Art

In general, an organic light emitting display device has a light emitting structure that includes a pixel electrode, an opposite electrode, and an organic light emitting layer formed therebetween. A light emitting structure may further include a hole injection layer formed between the pixel electrode and the organic light emitting layer, and an electron injection layer formed between the opposite electrode and the organic light emitting layer. In an organic light emitting display device, light is generated by excitons, which are combinations of holes injected from the hole injection layer and electrons injected from the electron injection layer, when the excitons decay from an excited state to a ground state. An organic light emitting display device does not require a separate light source, and thus an organic light emitting display device may be thin, light weight, as well having low power consumption. Furthermore, an organic light emitting display device has a wide viewing angle, high contrast, and a high response speed, etc.

An organic light emitting display device includes a plurality of pixels, and each of the plurality of pixels corresponds to a pixel electrode. The plurality of pixels may be incorporated into a pixel defining layer. The pixel defining layer covers an edge portion of a pixel electrode and exposes a center portion of the pixel electrode.

In a manufacturing process of a organic light emitting display device, the hole injection layer, the organic light emitting layer, the electron injection layer, etc., may be formed by inkjet printing, nozzle printing, etc. after forming the pixel defining layer. If the hole injection layer is formed on an upper portion of the pixel defining layer along a sidewall of the pixel defining layer, the pixel electrode and the opposite electrode may be electrically connected through the hole injection layer.

SUMMARY

Exemplary embodiments can provide an organic light emitting display device that includes a pixel defining structure that can increase adhesive strength between pixel defining layers.

According to exemplary embodiments, an organic light emitting display device includes an organic light emitting structure disposed on a substrate and that includes a pixel electrode, an organic light emitting layer and an opposite electrode, a pixel defining structure disposed on the substrate and that includes a first pixel defining layer that partially covers the pixel electrode and a second pixel defining layer disposed on the first pixel defining layer, and a first wiring disposed on the substrate and that is in contact with the first pixel defining layer and the second pixel defining layer. An adhesive strength between the second pixel defining layer and the first wiring is greater than an adhesive strength between the second pixel defining layer and the first pixel defining layer.

In exemplary embodiments, the first pixel defining layer may include an inorganic material. The second pixel defining layer may include an organic material. The second pixel defining layer may expose an edge portion of the first pixel defining layer.

In exemplary embodiments, the first pixel defining layer may include a first opening that exposes a portion of the first wiring. The second pixel defining layer may be in contact with the first wiring through the first opening.

In exemplary embodiments, the first wiring and the pixel electrode may be disposed in substantially the same layer on the substrate.

In exemplary embodiments, the organic light emitting display device may further include a second wiring disposed on the substrate and that is in contact with the first pixel defining layer and the second pixel defining layer. An adhesive strength between the second pixel defining layer and the second wiring may be greater than an adhesive strength between the second pixel defining layer and the first pixel defining layer.

In exemplary embodiments, the first pixel defining layer may include a second opening that exposes a portion of the second wiring. The second pixel defining layer may be in contact with the second wiring through the second opening.

In exemplary embodiments, the first wiring, the second wiring and the pixel electrode may be disposed in substantially the same layer on the substrate.

In exemplary embodiments, the organic light emitting display device may further include a transistor that includes an active pattern, a gate electrode, a source electrode and a drain electrode. The active pattern may be disposed on the substrate, and a gate insulation layer may be disposed on the substrate and covers the active pattern. A gate electrode may be disposed on the gate insulation layer, and an insulation interlayer may be disposed on the gate insulation layer and covers the gate electrode. The source electrode, the drain electrode, the pixel electrode, the first wiring and the second wiring may be disposed on the insulation interlayer. The pixel electrode may be integrally formed with the drain electrode. The second wiring may be integrally formed with the source electrode.

In some exemplary embodiments, the first wiring may be disposed on the first pixel defining layer. The second pixel defining layer may cover the first wiring.

In some exemplary embodiments, the first wiring may overlap a center portion of the second pixel defining layer. In some exemplary embodiments, the first wiring may overlap an edge portion of the second pixel defining layer.

In exemplary embodiments, the organic light emitting structure may further include a hole injection layer and a hole transport layer disposed under the organic light emitting layer, and an electron transport layer and an electron injection layer disposed over the organic light emitting layer. The hole injection layer may be in contact with a top surface of the pixel electrode and a sidewall of the first pixel defining layer. The hole transport layer may be in contact with a top surface of the first pixel defining layer and a sidewall of the second pixel defining layer.

According to another exemplary embodiment, an organic light emitting display device includes a light emitting structure disposed on a substrate the includes a pixel electrode, an organic light emitting layer and an opposite electrode, and a pixel defining structure disposed on the substrate that includes a first pixel defining layer that partially covers the pixel electrode and a second pixel defining layer disposed on the first pixel defining layer and that exposes an edge portion of the first pixel defining layer. The light emitting structure further includes a hole injection layer and a hole transport layer disposed under the organic light emitting layer, and an electron transport layer and an electron injection layer disposed over the organic light emitting layer. The hole injection layer is in contact with a top surface of the pixel electrode and a sidewall of the first pixel defining layer, and the hole transport layer is in contact with a top surface of the first pixel defining layer and a sidewall of the second pixel defining layer.

In exemplary embodiments, the organic light emitting display device may further include a first wiring disposed on the substrate and in contact with the first pixel defining layer and the second pixel defining layer, and a second wiring disposed in the substrate and in contact with the first pixel defining layer and the second pixel defining layer. The first pixel defining layer may include an inorganic material and the second pixel defining layer may include an organic material. An adhesive strength between the second pixel defining layer and the first wiring may be greater than an adhesive strength between the second pixel defining layer and the first pixel defining layer, and an adhesive strength between the second pixel defining layer and the second wiring may greater than an adhesive strength between the second pixel defining layer and the first pixel defining layer.

In exemplary embodiments, the first pixel defining layer may include a first opening that exposes a portion of the first wiring and a second opening that exposes a portion of the second wiring. The second pixel defining layer is in contact with the first wiring through the first opening, and the second pixel defining layer is in contact with the second wiring through the second opening.

In exemplary embodiments, the first wiring, the second wiring and the pixel electrode may be disposed in a same layer on the substrate.

In exemplary embodiments, the first wiring may be disposed on the first pixel defining layer, and the second pixel defining layer may cover the first wiring.

In exemplary embodiments, the first wiring may overlap a center portion of the second pixel defining layer.

In exemplary embodiments, the first wiring may overlap an edge portion of the second pixel defining layer.

In exemplary embodiments, the organic light emitting display device may further include a transistor that includes an active pattern, a gate electrode, a source electrode and a drain electrode. The active pattern may be disposed on the substrate, a gate insulation layer may be disposed on the substrate and covers the active pattern, a gate electrode may be disposed on the gate insulation layer, and an insulation interlayer may be disposed on the gate insulation layer and covers the gate electrode. The source electrode, the drain electrode, the pixel electrode, the first wiring and the second wiring may be disposed on the insulation interlayer, the pixel electrode may be integrally formed with the drain electrode, and the second wiring may be integrally formed with the source electrode.

According to exemplary embodiments, an organic light emitting display device includes a first wiring that has a relatively high adhesive strength with respect to the second pixel defining layer, so that the second pixel defining layer will not be displaced from a predetermined position on the first pixel defining layer. Moreover, because the data wiring is used as the first wiring, an additional deposition process for the first wiring is not required, which can reduce the manufacturing cost and the manufacturing time.

DETAILED DESCRIPTION OF EXEMPLARY EMBODIMENTS

Hereinafter, organic light emitting display devices in accordance with exemplary embodiments will be explained in detail with reference to the accompanying drawings.

Figure 1:
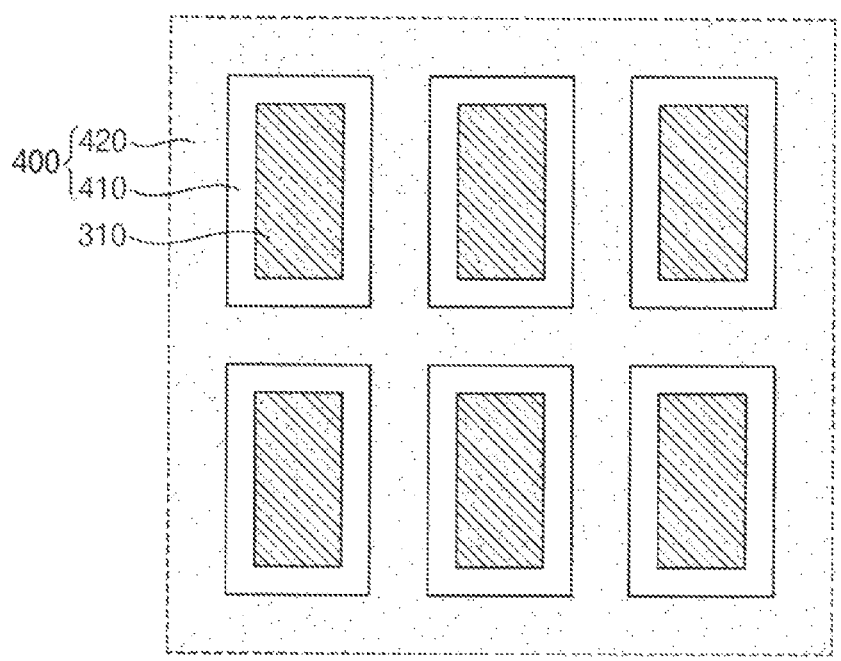
FIG. 1 is a plan view that illustrates an organic light emitting display device in accordance with exemplary embodiments.
Figure 2:
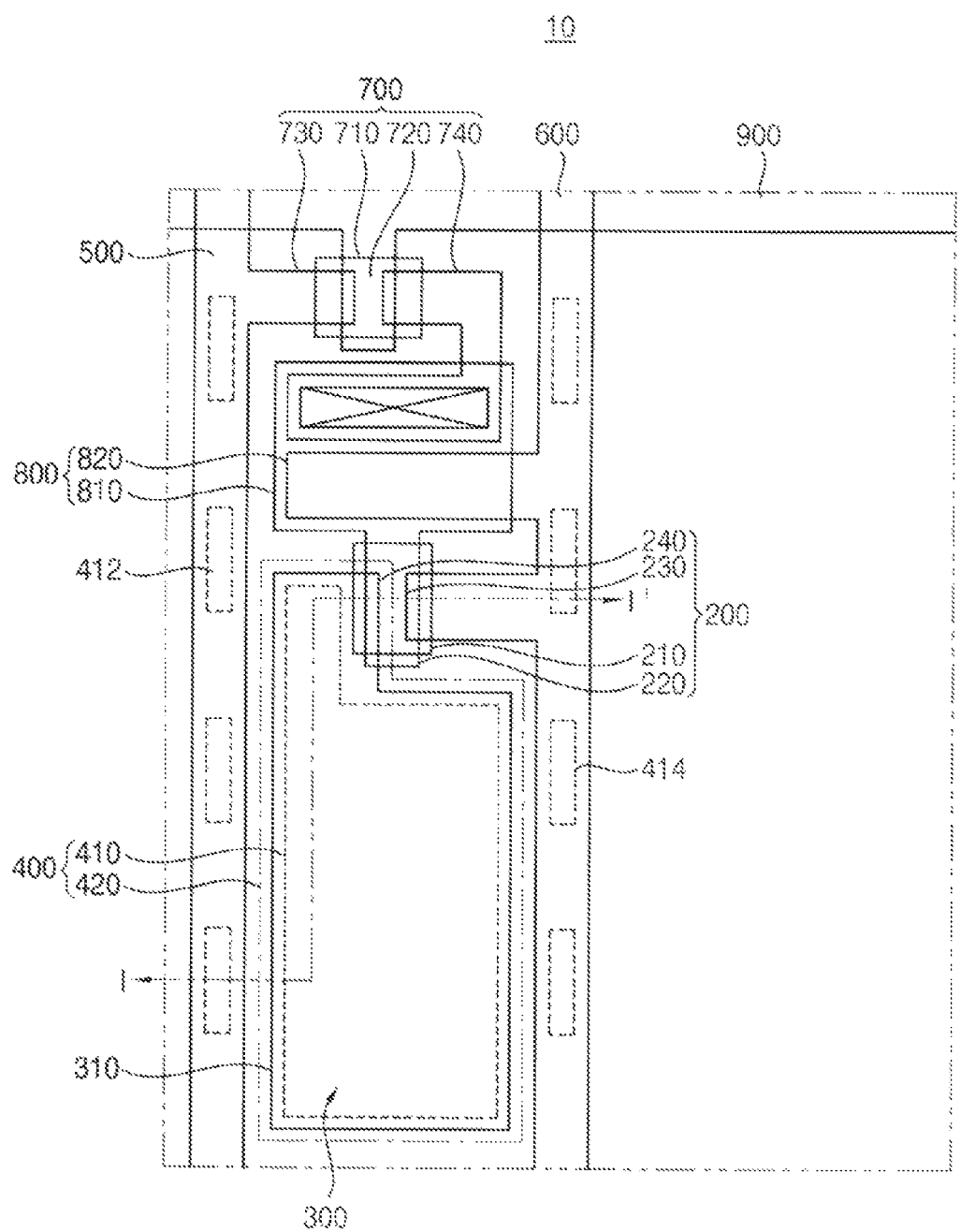
FIG. 2 is a plan view that illustrates a pixel of an organic light emitting display device of FIG. 1 in accordance with exemplary embodiments.

FIG. 1 is a plan view that illustrates an organic light emitting display device in accordance with exemplary embodiments. FIG. 2 is a plan view that illustrates a pixel of an organic light emitting display device in FIG. 1 in accordance with exemplary embodiments. For example, FIG. 1 illustrates a portion of an organic light emitting display device in accordance with exemplary embodiments.

Referring to FIGS. 1 and 2, an organic light emitting display device 10 according to exemplary embodiments includes a display region in which a plurality of pixels are disposed. In FIG. 1, the plurality of pixels are arranged along a first direction and along a second direction substantially perpendicular to the first direction. However, an arrangement of the pixels is not limited thereto in other embodiments.

According to embodiments, each pixel includes a switching transistor 700, a driving transistor 200, a capacitor 800, a pixel defining structure 400, and a light emitting structure 300. The organic light emitting display device 10 furthers include a gate wiring 900 that extends in the first direction, and a first wiring 500 and a second wiring 600 that extend in the second direction. For example, the gate wiring 900 transmits a gate voltage to the pixels. In exemplary embodiments, the first wiring 500 corresponds to a data wiring, and the second wiring 600 corresponds to a common voltage wiring. For example, the first wiring 500 transmits a data voltage to the pixels, and the second wiring 600 transmits a common voltage to the pixels.

Figure 3:
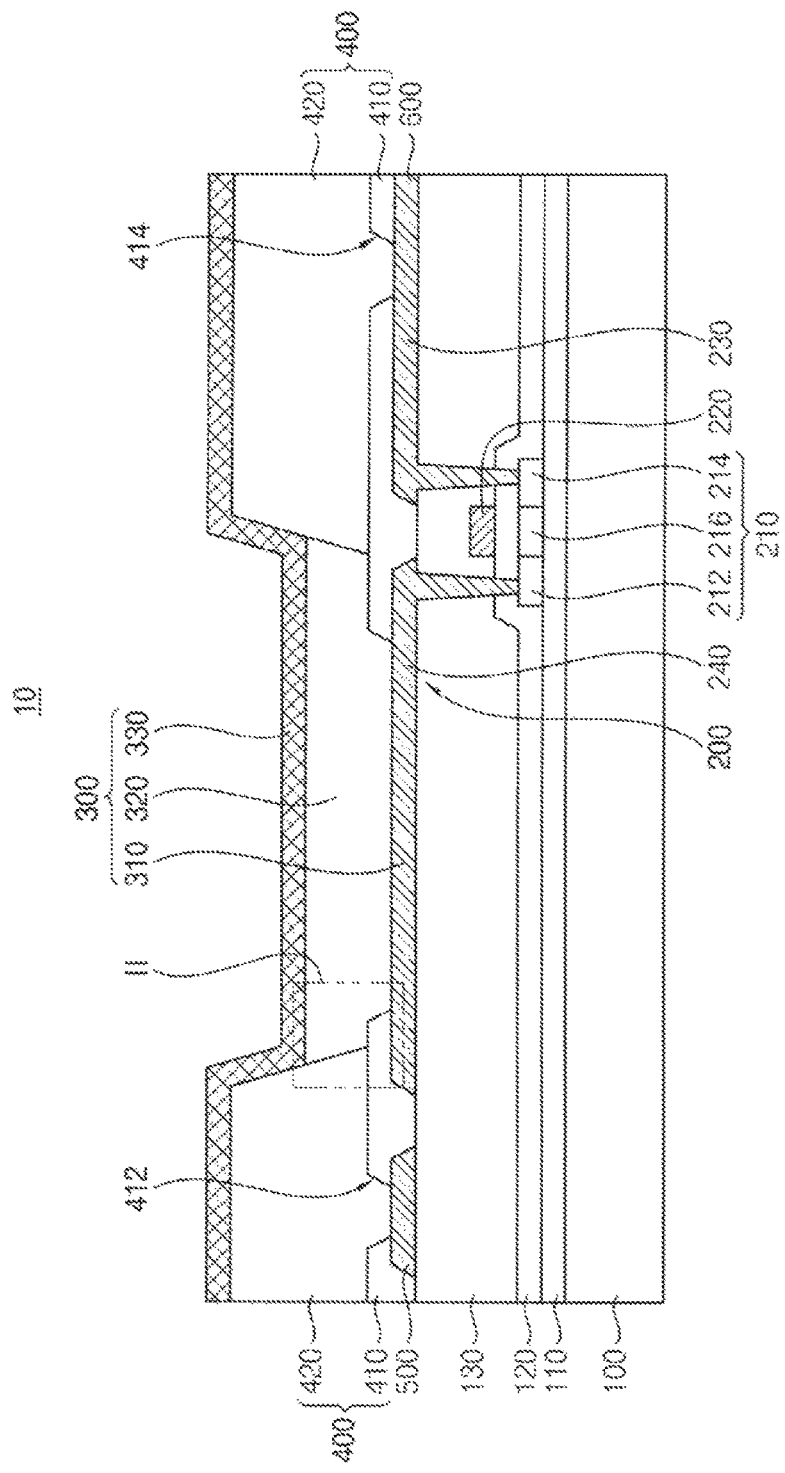
FIG. 3 is a cross-sectional view taken along a line I-I' in FIG. 2 that illustrates an organic light emitting display device in accordance with exemplary embodiments.
Figure 4:
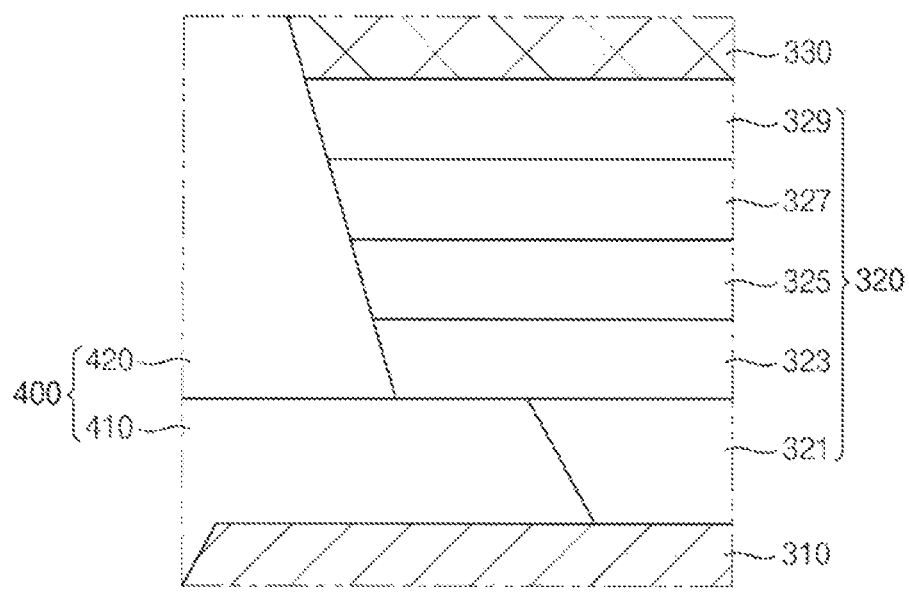
FIG. 4 is a cross-sectional view illustrating a portion 'II' of an organic light emitting display device in FIG. 3.

According to embodiments, the light emitting structure 300 includes a pixel electrode 310, a light emitting layer 320 shown in FIG. 3 that includes an organic light emitting layer 325 shown in FIG. 4, and an opposite electrode 330 shown in FIG. 3. Here, the pixel electrode 310 serves as an anode that injects holes, and the opposite electrode 330 serves as a cathode that injects electrons. The holes are injected into the organic light emitting layer 325 from the pixel electrode 310, and the electrons are injected into the organic light emitting layer 325 from the opposite electrode 330. When excitons formed from the combination of the injected holes and the injected electrons decay from an excited state to a ground state, light is generated. In some exemplary embodiments, the pixel electrode 310 serves as the cathode, and the opposite electrode 330 serves as the cathode. Here, at least one pixel electrode 310 is formed per pixel, and the organic light emitting display device 10 includes a plurality of pixel electrodes 310 separated from each other.

According to embodiments, the switching transistor 700 includes a switching active pattern 710, a switching gate electrode 720, a switching source electrode 730 and a switching drain electrode 740. The driving transistor 200 includes a driving active pattern 210, a driving gate electrode 220, a driving source electrode 230 and a driving drain electrode 240. The capacitor 800 includes a first plate 810 and a second plate 820.

According to embodiments, the switching transistor 700 is used as a switching element to select at least one pixel from the plurality of pixels. The switching gate electrode 720 is connected to the gate wiring 900, and the switching source electrode 730 is connected to the first wiring 500 that corresponds to the data wiring. The switching drain electrode 740 is separated from the switching source electrode 730 and connected to the first plate 810. For example, as illustrated in FIG. 2, the switching drain electrode 740 is connected to the first plate 810 through a contact hole.

According to embodiments, the driving transistor 200 applies a driving voltage to the pixel electrode 310 to emit light from the organic light emitting layer 325 of the light emitting structure 300 in the selected pixel. The driving gate electrode 220 is connected to the first plate 810, and each of the driving source electrode 230 and the second plate 820 is connected to the second wiring 600 that corresponds to the common voltage wiring. The pixel electrode 310 extends from the driving drain electrode 240 and is electrically connected to the driving transistor 200. In some exemplary embodiments, the pixel electrode 310 is disposed in substantially the same layer as the driving source electrode 230 and the driving drain electrode 240.

According to embodiments, the switching transistor 700 is operated based on the gate voltage from the gate wiring 900, and transmits a data voltage from the first wiring 500 that corresponds to the data wiring to the driving transistor 200. A voltage difference between the common voltage and the data voltage is charged in the capacitor 800. A current corresponding to the charged voltage in the capacitor 800 flows to the light emitting structure 300 through the driving transistor 200, and light is emitted from the organic light emitting layer 325.

In exemplary embodiments, the switching active pattern 710, the driving active pattern 210 and the first plate 810 are disposed in substantially the same layer. The switching gate electrode 720, driving gate electrode 220, the second plate 820 and the gate wiring 900 are disposed on the gate insulation layer 120 in FIG. 3. The switching source and drain electrodes 730 and 740, driving source and drain electrodes 230 and 240, the first wiring 500 and the second wiring 600 are disposed on the insulation interlayer 130 in FIG. 3. Here, a position of each of the first and the second plates 810 and 820 is not limited to the above mentioned exemplary embodiments, and the first and the second plates 810 and 820 may face each other across the gate insulation layer 120 and/or the insulation interlayer 130 in other embodiments.

FIG. 3 is a cross-sectional view taken along line I-I' in FIG. 2 that illustrates an organic light emitting display device in accordance with exemplary embodiments.

Referring to FIG. 3, the organic light emitting display device 10 in accordance with exemplary embodiments, includes the driving transistor 200, the light emitting structure 300, the pixel defining structure 400, the first wiring 500 and the second wiring 600. Each of the switching active pattern 710, the switching gate electrode 720, the switching source electrode 730 and the switching drain electrode 740 of the switching transistor 700 are substantially the same as or similar to each of the driving active pattern 210, the driving gate electrode 220, the driving source electrode 230 and the driving drain electrode 240 of the driving transistor 210, so that the switching transistor 700 will not be explained.

According to embodiments, the substrate 100 includes a transparent substrate, such as a glass substrate, a quartz substrate, a transparent plastic substrate, etc. Alternatively, the substrate 100 may be a flexible substrate.

According to embodiments, a buffer layer 110 is disposed on the substrate 100. The buffer layer 110 can prevent diffusion of impurities from the substrate 100 toward the upper structures. The buffer layer 110 can control a heat transfer rate in a crystallization process that forms the driving active pattern 210, and can serve as a planarization layer. The buffer layer 110 may include a silicon compound, such as silicon oxide ($SiO_x$), silicon nitride ($SiN_x$), silicon oxynitride ($SiO_xN_y$), etc. The buffer layer 110 may have a single layer structure or a multi-layer structure. In some exemplary embodiments, the buffer layer 110 is omitted.

According to embodiments, the driving active pattern 210 is disposed on the buffer layer 110. In some embodiments, the driving active pattern 210 includes a silicon compound or polysilicon. A driving source region 212 and a driving drain region 214, each of which contains impurities, is formed on both sides of the driving active pattern 210. A driving channel region 216 that does not contain impurities is defined between the driving source region 212 and the driving drain region 214.

According to embodiments, a gate insulation layer 120 is disposed on the buffer layer 110 and substantially covers the driving active pattern 210. The gate insulation layer 120 may include a silicon compound such as silicon oxide, silicon nitride, silicon oxynitride, etc. The gate insulation layer 120 may have a single layer structure or a multi-layer structure.

According to embodiments, the driving gate electrode 220 is disposed on the gate insulation layer 120. The driving gate electrode 220 substantially overlaps at least portion of the driving active pattern 210, specifically the driving channel region 216. The driving gate electrode 220 may include a metal, such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), alloys thereof, nitrides thereof, etc. These may be used alone or in a combination thereof.

According to embodiments, an insulation interlayer 130 is disposed on the gate insulation layer 120 to substantially cover the driving gate electrode 220. The insulation interlayer 130 may include a silicon compound such as silicon oxide, silicon nitride, silicon oxynitride, etc. The insulation interlayer 130 may have a single layer structure or a multi-layer structure. The insulation interlayer 130 can serve as a planarization layer for the upper structures. Contact holes that expose the driving source region 212 and the driving drain region 214 of the driving active pattern 210 are provided in each of the gate insulation layer 120 and the insulation interlayer 130.

According to embodiments, the driving source electrode 230, the driving drain electrode 240, the pixel electrode 310, the first wiring 500, and the second wiring 600 are disposed on the insulation interlayer 130. The driving source electrode 230 and the driving drain electrode 240 are electrically connected to the driving source region 212 and the driving drain region 214, respectively, through the contact holes. In exemplary embodiments, the pixel electrode 310 is integrally formed with the driving drain electrode 240, and the second wiring 600 is integrally formed with the driving source electrode 230. Each of the driving source electrode 230, the driving drain electrode 240, the pixel electrode 310, the first wiring 500 and the second wiring 600 may include aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Se), alloys thereof, etc. Alternatively, each of the driving source electrode 230, the driving drain electrode 240, the pixel electrode 310, the first wiring 500 and the second wiring 600 may include a transparent conductive material.

According to embodiments, the pixel defining structure 400 includes a first pixel defining layer 410 and a second pixel defining layer 420 disposed on the first pixel defining layer 410 and that is formed from a different material from the first pixel defining layer 410.

According to embodiments, the first pixel defining layer 410 is disposed on the insulation interlayer 130 to substantially cover the driving source electrode 230 and the driving drain electrode 240, and to partially cover the first wiring 500, the second wiring 600 and the pixel electrode 310. For example, the first pixel defining layer 410 may cover an edge portion of the pixel electrode 310 to expose a center portion of the pixel electrode 310. Moreover, the first pixel defining layer 410 exposes a portion of the first wiring 500 and a portion of the second wiring 600.

In exemplary embodiments, the first pixel defining layer 410 includes an inorganic material. For example, the first pixel defining layer 410 may include at least one of silicon oxide (SiOx), silicon nitride (SiNx), silicon oxynitride (SiOxNy), aluminum oxide (AlOx), copper oxide (CuOx), terbium oxide (TbOx), yttrium oxide (YOx), niobium oxide (NbOx), and praseodymium oxide (PrOx). In some embodiments, a thickness of the first pixel defining layer 410 is substantially less than about 1000 angstrom (Å).

According to embodiments, the first pixel defining layer 410 has a first opening 412 that partially exposes the first wiring 500 and a second opening 414 that partially exposes the second wiring 600. For example, the first opening 412 exposes at least a portion of the first wiring 500 and the second opening 414 exposes at least a portion of the second wiring 600.

In exemplary embodiments, as illustrated in FIG. 2, the first pixel defining layer 410 has a plurality of first openings 412 and a plurality of second openings 414. In this case, the first openings 412 are arranged along a direction in which the first wiring 500 extends, and the second openings 414 are arranged along a direction in which the second wiring 600 extends. In FIG. 2, each of the first openings 412 and the second openings 414 has a substantially rectangular shape, however, shapes of the first openings 412 and the second openings 414 may be not limited thereto in other embodiments.

Referring again to FIG. 3, according to embodiments, the second pixel defining layer 420 is disposed on the first pixel defining layer 410. The second pixel defining layer 420 is spaced a predetermined distance inward from a side of the first pixel defining layer 410. In other words, the second pixel defining layer 420 exposes an edge portion of the first pixel defining layer 410. The second pixel defining layer 420 is substantially thicker than the first pixel defining layer 410.

In exemplary embodiments, the second pixel defining layer 420 includes an organic material. For example, the second pixel defining layer 420 may include at least one of a polyacryl, a polyimide, a polyamide, a benzo cyclo butane, an acryl resin, and a phenol resin.

According to embodiments, the second pixel defining layer 420 partially covers the first pixel defining layer 410 and is in contact with the first wiring 500 through the first opening 412 and the second wiring 600 through the second opening 414.

In exemplary embodiments, an adhesive strength between the second pixel defining layer 420 and the first wiring 500 is substantially greater than an adhesive strength between the second pixel defining layer 420 and the first pixel defining layer 410. Moreover, an adhesive strength between the second pixel defining layer 420 and the second wiring 600 is substantially greater than the adhesive strength between the second pixel defining layer 420 and the first pixel defining layer 410. Although the adhesive strength between the second pixel defining layer 420 and the first pixel defining layer 410 is relatively weak, the adhesive strength between the second pixel defining layer 420 and the first wiring 500, and the adhesive strength between the second pixel defining layer 420 and the second wiring 600 is relatively strong. Therefore, the second pixel defining layer 420 will not be displaced from its predetermined position on the first pixel defining layer 410.

In exemplary embodiments, a data wiring is the first wiring 500, so that no additional process is required to form the first wiring 500. In addition, a common voltage wiring is the second wiring 600, so that no additional process is required to form the second wiring 600. Therefore, a manufacturing cost and a manufacturing time can be reduced.

According to embodiments, the light emitting layer 320 is disposed on the pixel electrode 310. The light emitting layer 320 includes an organic light emitting layer 325 in which holes and electrons respectively injected from the pixel electrode 310 and the opposite electrode 330 combine to emit light. In exemplary embodiments, the light emitting layer 320 further includes a hole injection layer, a hole transport layer, an electron transport layer, and an electron injection layer.

FIG. 4 is a cross-sectional view that illustrates a portion of an organic light emitting display device in FIG. 3.

Referring to FIG. 4, according to embodiments, the hole injection layer 321 is disposed on the pixel electrode 310, and the hole transport layer 323 is disposed on the hole injection layer 321. The hole injection layer 321 may include 4,4',4"-tris(3-methylphenylamino)triphenyl amine ("m-MTDATA"), 3,5-tris[4-(3-methylphenyl amino)phenyl]benzene ("m-MTDAPB"), phthalocyanine compound such as copper phthalocyanine ("CuPc"), 4,4",4"-tris(N-carbazolyl)triphenylamine ("TCTA"), which is one of starburst type amines, N,N"-di(4-(N,N'-diphenylamino)phenyl)-N,N'-diphenyl-benzidine ("DNTPD"), etc. The hole transport layer 323 may include N-phenylcarbazole, polyvinylcarbazole, 1,3,5-tricarbazole-benzene, 4,4'-bis carbazolyl biphenyl, m-bis carbazolyl phenyl, etc.

In exemplary embodiments, the hole injection layer 321 is in contact with a top surface of the pixel electrode 310 and a sidewall the first pixel defining layer 410, and the hole transport layer 323 is in contact with a top surface of the first pixel defining layer 410 and a sidewall of the second pixel defining layer 420. Therefore, the hole injection layer 321 does not contact an upper portion of the pixel defining structure 400, so that the pixel electrode 310 and the opposite electrode 330 are not electrically connected through the hole injection layer 321.

According to embodiments, the organic light emitting layer 325 is disposed on the hole transport layer 323. The organic light emitting layer 325 includes a host material that is excited by holes and electrons, and a dopant material that facilitates energy absorbance and release and improves light emitting efficiency.

According to embodiments, the electron transport layer 327 is disposed on the organic light emitting layer 325, and the electron injection layer 329 is disposed on the electron transport layer 327. The electron transport layer 327 may include 2,9-dimethyl-4,7-diphenylphenanthroline ("DPh-Phen"), poly[(9,9-di-hexylfluorene-2,7-diyl)-co-(pyridine-3,5-diyl)] ("PF-Py"), bis(10-hydroxybenzo[h]quinolinato) beryllium ("Bebq2"), etc. The electron injection layer 329 may include lithium fluoride (LiF), sodium chloride (NaCl), barium fluoride (BaF), cesium fluoride (CsF), lithium oxide ($Li_2O$), etc.

Referring to FIG. 3 again, according to embodiments, the opposite electrode 330 is disposed on the light emitting layer 320 and the second pixel defining layer 420. The opposite electrode 330 faces the pixel electrode 310 with the light emitting layer 320 disposed therebetween. The opposite electrode 330 can be a common electrode that is commonly disposed over the plurality of pixels. The opposite electrode 330 may include a metal having a relatively low work function, such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), or alloys thereof.

Figure 5:
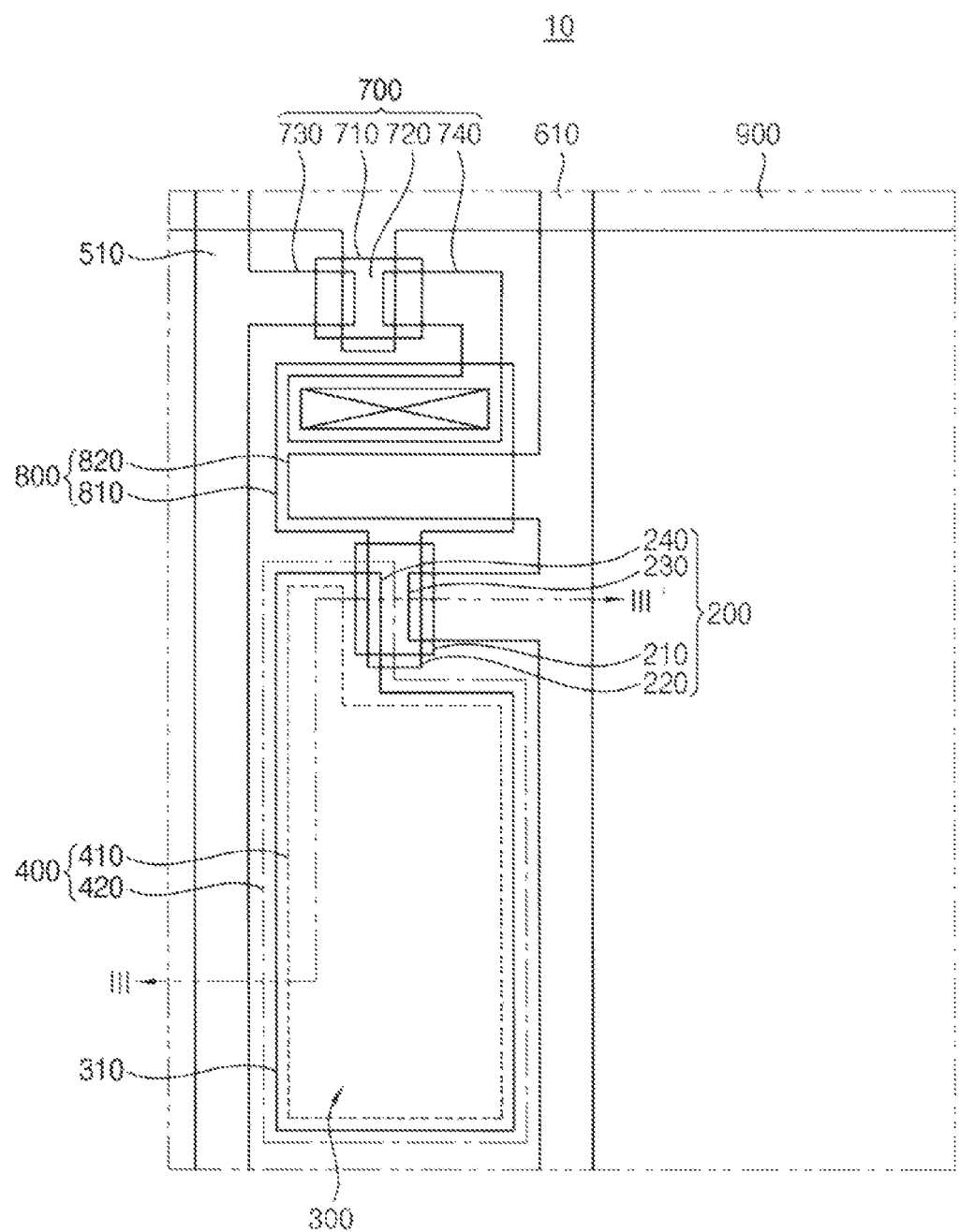
FIG. 5 is a plan view that illustrates a pixel of an organic light emitting display device in FIG. 1 in accordance with some exemplary embodiments.
Figure 6:
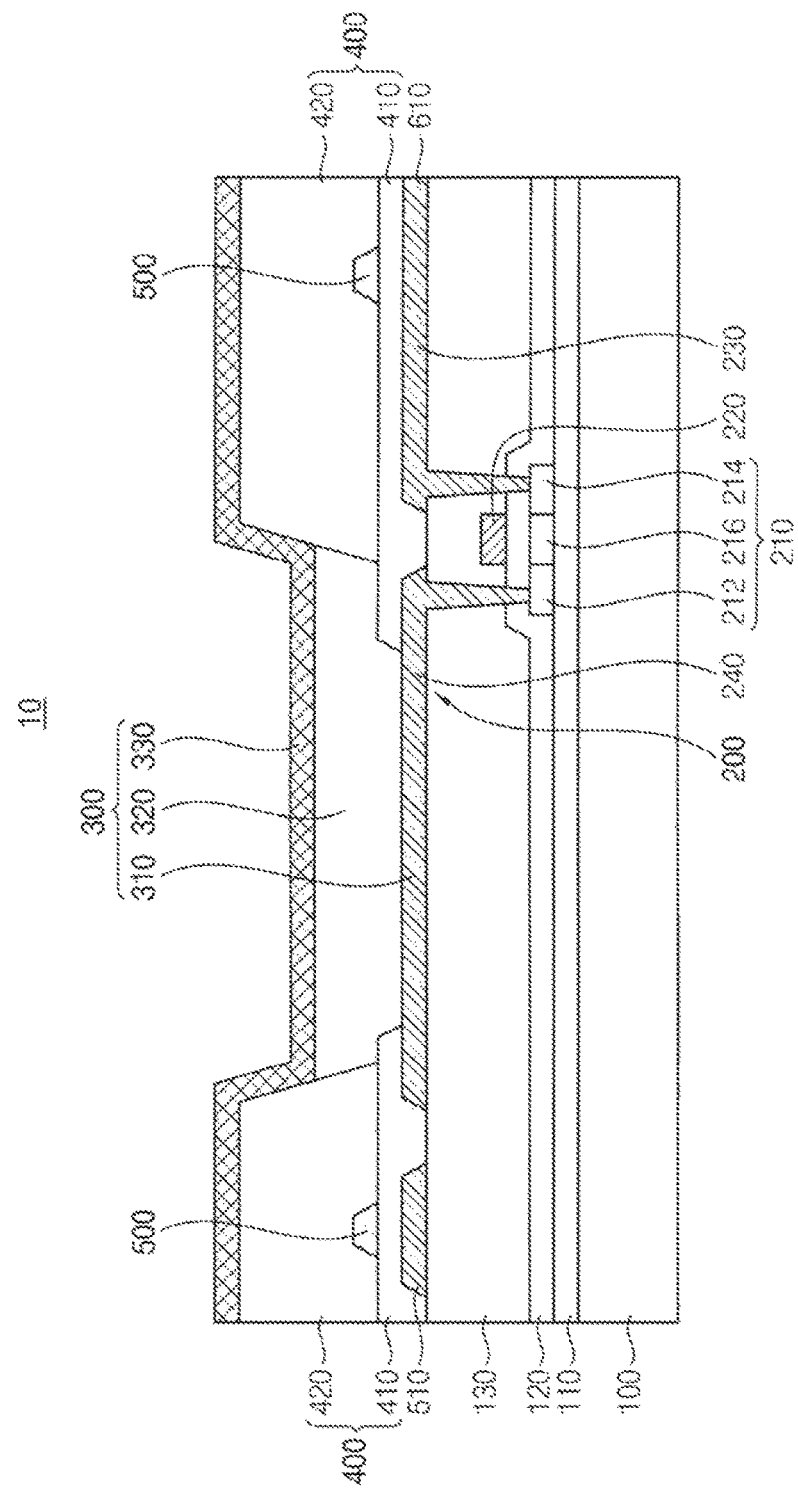
FIGS. 6 and 7 are cross-sectional views taken along a line III-III' in FIG. 5 that illustrate an organic light emitting display device in accordance with exemplary embodiments.
Figure 7:
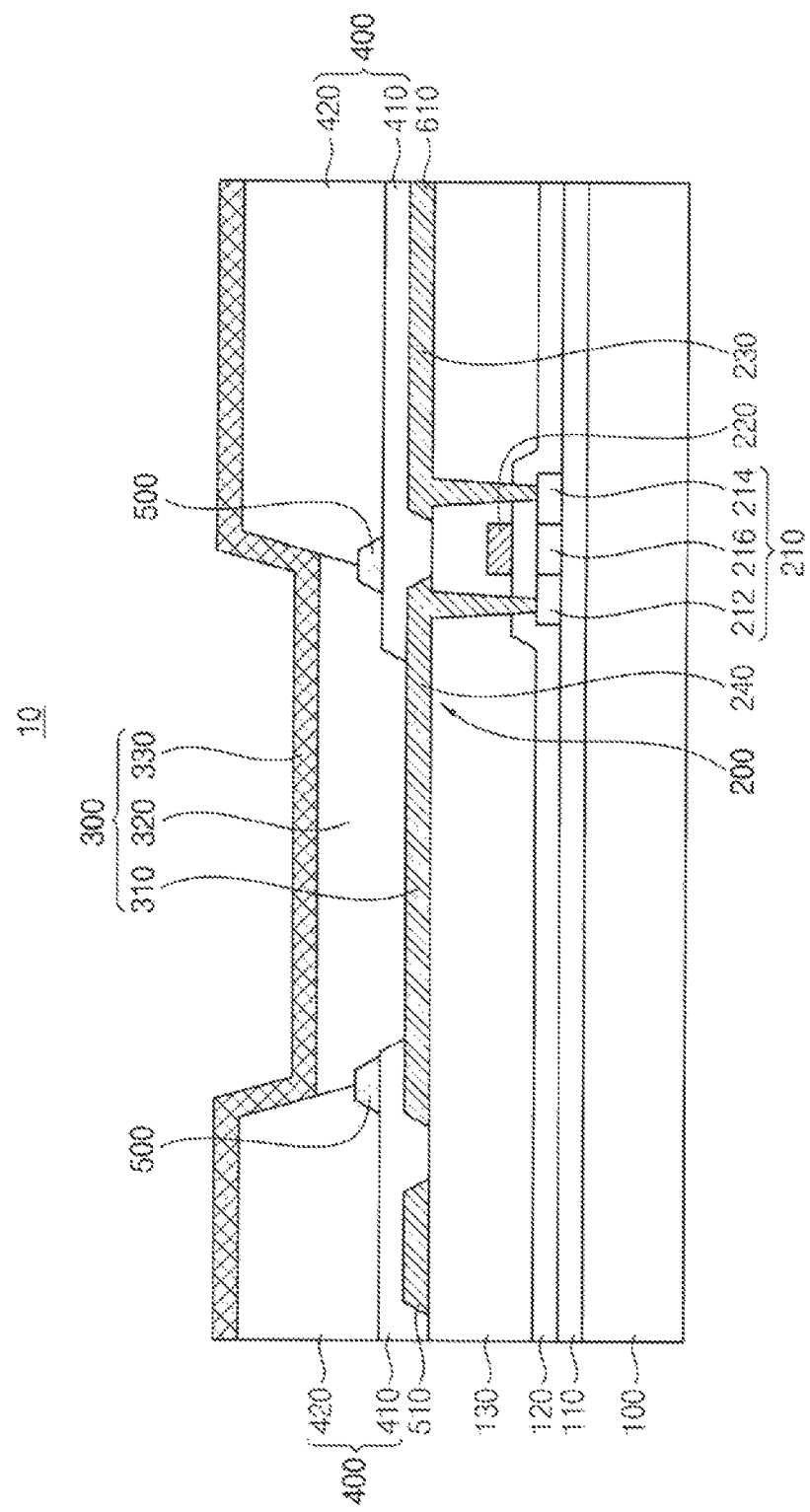

FIG. 5 is a plan view that illustrates a pixel of an organic light emitting display device in FIG. 1 in accordance with some exemplary embodiments. FIGS. 6 and 7 are cross-sectional views taken along a line III-III' in FIG. 5 that illustrate an organic light emitting display device in accordance with exemplary embodiments.

Referring to FIGS. 5 to 7, an organic light emitting display device 10 in accordance with some exemplary embodiments includes a switching transistor 700, a driving transistor 200, a capacitor 800, a light emitting structure 300, a pixel defining structure 400, a first wiring 500, a data wiring 510 and a common voltage wiring 610. Detailed descriptions of elements of the organic light emitting display device illustrated with reference to FIGS. 5 to 7 which are substantially the same as or similar to those illustrated with reference to FIGS. 1 to 4 will not be repeated.

According to embodiments, the driving source electrode 230, the driving drain electrode 240, the pixel electrode 310, the data wiring 510 and the common voltage wiring 610 are disposed on the insulation interlayer 130. In exemplary embodiments, the pixel electrode 310 is integrally formed with the driving drain electrode 240, and the common voltage wiring 610 is integrally formed with the driving source electrode 230.

According to embodiments, the pixel defining structure 400 includes the first pixel defining layer 410 and the second pixel defining layer 420 disposed on the first pixel defining layer 410.

According to embodiments, the first pixel defining layer 410 is disposed on the insulation interlayer 130 and substantially covers the driving source electrode 230, the driving drain electrode 240, the pixel electrode 310, the data wiring 510 and the common voltage wiring 610. For example, the first pixel defining layer 410 covers an edge portion of the pixel electrode 310 and exposes a center portion of the pixel electrode 310.

According to embodiments, the first wiring 500 is disposed on the first pixel defining layer 410. For example, the first wiring 500 corresponds to a dummy wiring that does not transmit a signal.

According to embodiments, the second pixel defining layer 420 is disposed on the first pixel defining layer 410 and covers the first wiring 500. The second pixel defining layer 420 is spaced a predetermined distance inward from a side of the first pixel defining layer 410. In other words, the second pixel defining layer 420 exposes an edge portion of the first pixel defining layer 410. The second pixel defining layer 420 is substantially thicker than the second pixel defining layer 410.

According to embodiments, the second pixel defining layer 420 is disposed on the first pixel defining layer 410 and entirely covers the first wiring 500. The first pixel defining layer 410 and the second pixel defining layer 420 are made from different materials.

In exemplary embodiments, an adhesive strength between the second pixel defining layer 420 and the first wiring 500 is substantially greater than an adhesive strength between the second pixel defining layer 420 and the first pixel defining layer 410. Although the adhesive strength between the second pixel defining layer 420 and the first pixel defining layer 410 is relatively weak, the adhesive strength between the second pixel defining layer 420 and the first wiring 500 is relatively strong. Therefore, the second pixel defining layer 420 will not be displaced from its predetermined position on the first pixel defining layer 410.

In exemplary embodiments, as illustrated in FIG. 6, the first wiring 500 overlaps a center portion of the second pixel defining layer 420. In this case, the second pixel defining layer 420 substantially covers an entirety of the top surface and an entirety of the sidewall of the first wiring 500.

In exemplary embodiments, as illustrated in FIG. 7, the first wiring 500 overlaps an edge portion of the second pixel defining layer 420. In this case, the second pixel defining layer 420 covers a portion of the top surface and a portion of the sidewall of the first wiring 500.

An organic light emitting display device according to exemplary embodiments can be incorporated into various electronic devices. For example, an organic light emitting display device may be incorporated into a computer, a notebook, a mobile phone, a smart phone, a smart pad, a personal media player, a personal digital assistance, an MP3 player, a digital camera, a video camcorder, etc.

Although a few exemplary embodiments have been described, those skilled in the art will readily appreciate that many modifications are possible in the exemplary embodiments without materially departing from the novel teachings and advantages of embodiments of the present inventive concept.

What is claimed is:

1. An organic light emitting display device, comprising:
  a light emitting structure disposed on a substrate, the light emitting structure including a pixel electrode, an organic light emitting layer and an opposite electrode;
  a pixel defining structure disposed on the substrate, the pixel defining structure including a first pixel defining layer that partially covers the pixel electrode and a second pixel defining layer disposed on the first pixel defining layer;
a first wiring disposed between the substrate and the first pixel defining layer and between the substrate and the second pixel defining layer, the first wiring being in contact with the first pixel defining layer and the second pixel defining layer;
a second wiring disposed in the substrate, the second wiring being in contact with the first pixel defining layer and the second pixel defining layer; and
a transistor that includes an active pattern, a gate electrode, a source electrode and a drain electrode, wherein the active pattern is disposed on the substrate,
wherein the pixel electrode is integrally formed with the drain electrode, and the second wiring is integrally formed with the source electrode.

2. The organic light emitting display device of claim 1, wherein the first pixel defining layer includes an inorganic material, the second pixel defining layer includes an organic material and exposes an edge portion of the first pixel defining layer.

3. The organic light emitting display device of claim 1, wherein the first pixel defining layer includes a first opening that exposes a portion of the first wiring, and the second pixel defining layer is in contact with the first wiring through the first opening.

4. The organic light emitting display device of claim 1, wherein the first wiring and the pixel electrode are disposed in a same layer on the substrate.

5. The organic light emitting display device of claim 1,
wherein an adhesive strength between the second pixel defining layer and the first wiring is greater than an adhesive strength between the second pixel defining layer and the first pixel defining layer, and
wherein an adhesive strength between the second pixel defining layer and the second wiring is greater than an adhesive strength between the second pixel defining layer and the first pixel defining layer.

6. The organic light emitting display device of claim 1, wherein the first pixel defining layer includes a second opening that exposes a portion of the second wiring, and the second pixel defining layer is in contact with the second wiring through the second opening.

7. The organic light emitting display device of claim 6, wherein the first wiring, the second wiring and the pixel electrode are disposed in a same layer on the substrate.

8. The organic light emitting display device of claim 1, further comprising
a gate insulation layer disposed on the substrate and covers the active pattern, wherein the gate electrode is disposed on the gate insulation layer, and
an insulation interlayer disposed on the gate insulation layer and covers the gate electrode,
wherein the source electrode, the drain electrode, the pixel electrode, the first wiring and the second wiring are disposed on the insulation interlayer.

9. The organic light emitting display device of claim 1, wherein the light emitting structure further includes a hole injection layer and a hole transport layer disposed under the organic light emitting layer, and an electron transport layer and an electron injection layer disposed over the organic light emitting layer,
wherein the hole injection layer is in contact with a top surface of the pixel electrode and a sidewall of the first pixel defining layer, and the hole transport layer is in contact with a top surface of the first pixel defining layer and a sidewall of the second pixel defining layer.

10. An organic light emitting display device, comprising:
a light emitting structure disposed on a substrate, the light emitting structure including a pixel electrode, an organic light emitting layer and an opposite electrode; and
a pixel defining structure disposed on the substrate, the pixel defining structure including a first pixel defining layer that partially covers the pixel electrode and a second pixel defining layer disposed on the first pixel defining layer and that exposes an edge portion of the first pixel defining layer,
wherein the light emitting structure further includes a hole injection layer and a hole transport layer disposed under the organic light emitting layer, and an electron transport layer and an electron injection layer disposed over the organic light emitting layer,
wherein the hole injection layer is in contact with a top surface of the pixel electrode and a sidewall of the first pixel defining layer, and the hole transport layer is in contact with a top surface of the first pixel defining layer and a sidewall of the second pixel defining layer.

11. The organic light emitting display device of claim 10, further comprising:
a first wiring disposed on the substrate, the first wiring being in contact with the first pixel defining layer and the second pixel defining layer; and
a second wiring disposed in the substrate, the second wiring being in contact with the first pixel defining layer and the second pixel defining layer,
wherein the first pixel defining layer includes an inorganic material and the second pixel defining layer includes an organic material,
wherein an adhesive strength between the second pixel defining layer and the first wiring is greater than an adhesive strength between the second pixel defining layer and the first pixel defining layer, and
an adhesive strength between the second pixel defining layer and the second wiring is greater than an adhesive strength between the second pixel defining layer and the first pixel defining layer.

12. The organic light emitting display device of claim 11, wherein
the first pixel defining layer includes a first opening that exposes a portion of the first wiring and a second opening that exposes a portion of the second wiring,
the second pixel defining layer is in contact with the first wiring through the first opening, and the second pixel defining layer is in contact with the second wiring through the second opening.

13. The organic light emitting display device of claim 11, wherein the first wiring, the second wiring and the pixel electrode are disposed in a same layer on the substrate.

14. The organic light emitting display device of claim 11, wherein the first wiring is disposed on the first pixel defining layer, and the second pixel defining layer covers the first wiring.

15. The organic light emitting display device of claim 14, wherein the first wiring overlaps a center portion of the second pixel defining layer.

16. The organic light emitting display device of claim 14, wherein the first wiring overlaps an edge portion of the second pixel defining layer.

17. The organic light emitting display device of claim 11, further comprising a transistor that includes an active pattern, a gate electrode, a source electrode and a drain electrode,
- wherein the active pattern is disposed on the substrate, a gate insulation layer is disposed on the substrate and covers the active pattern, a gate electrode is disposed on the gate insulation layer, an insulation interlayer is disposed on the gate insulation layer and covers the gate electrode, and
- the source electrode, the drain electrode, the pixel electrode, the first wiring and the second wiring are disposed on the insulation interlayer, wherein the pixel electrode is integrally formed with the drain electrode, and wherein the second wiring is integrally formed with the source electrode.

\* \* \* \* \*